United States Patent [19]

Hoenig

[11] Patent Number: 4,771,239
[45] Date of Patent: Sep. 13, 1988

[54] MULTICHANNEL DEVICE WITH SUPERCONDUCTOR GRADIOMETERS FOR MEASURING WEAK MAGNETIC FIELDS

[75] Inventor: Eckhardt Hoenig, Erlangen, Fed. Rep. of Germany

[73] Assignee: Siemens Aktiengesellschaft, Müchen, Fed. Rep. of Germany

[21] Appl. No.: 887,230

[22] Filed: Jul. 18, 1986

[30] Foreign Application Priority Data

Jul. 22, 1985 [DE] Fed. Rep. of Germany ....... 3526169

[51] Int. Cl.$^4$ ................ G01R 33/035; G01R 33/022; A61B 5/05
[52] U.S. Cl. .................................. 324/248; 128/653; 307/306; 324/262
[58] Field of Search ................. 324/248, 262; 29/599; 307/306; 357/5; 128/653, 654; 336/200, 208

[56] References Cited

U.S. PATENT DOCUMENTS

| | | | |
|---|---|---|---|
| 3,980,076 | 9/1976 | Wikswo et al. | 324/248 X |
| 4,320,341 | 3/1982 | Lutes | 324/248 |
| 4,549,135 | 10/1985 | Vaidya | 324/248 |
| 4,591,787 | 5/1986 | Hoenig | 324/248 |
| 4,613,817 | 9/1986 | Hoenig | 324/248 |

FOREIGN PATENT DOCUMENTS

| | | |
|---|---|---|
| 0130490 | 1/1985 | European Pat. Off. . |
| 3247543 | 6/1984 | Fed. Rep. of Germany . |
| 0129681 | 7/1985 | Japan ................................ 324/248 |

OTHER PUBLICATIONS

Journ. Appl. Phys., vol. 54 (1983) Oct., No. 10, pp. 6065-6067(A), Carelli et al.
J. Phys. E; Sci. Instrum., vol. 13, 1980, pp. 801-813, Swithenby, S. J.
IEEE Trans. Electr.Dev., vol. ED-27, No. 10, Oct. 1980, pp. 1896-1908, Clarke, J.
Biomagnetism, Berlin 1980, Berlin/N.Y., 1981, pp. 3-31, Katila, T.
Rev. Sci. Instrum. 52(12), Dec. 1982, pp. 1815-1845, Romani et al.
IEEE Trans. Magn., vol. MAG-17, No. 1, Jan. 1981, pp. 400-403, Jaycox et al.

Primary Examiner—Gerard R. Strecker
Attorney, Agent, or Firm—Kenyon & Kenyon

[57] ABSTRACT

A multichannel device for measuring weak, varying magnetic fields contains in each channel a gradiometer formed by superconducting loops on a planar carrier element; a superconducting direct current quantum interferometer (DC-SQUID) rigidly joined to the carrier element mechanically; and superconducting rigidly connecting links between the gradiometer and the interferometer, including a coupling-in coil. The active area of the gradiometer system is to be kept as small as possible and should approach the contour of a patient to be examined at the same time. Towards this end, several planar carrier elements fastened to one common carrier structure are provided, there being disposed on each carrier element the superconducting components such as the gradiometer, interferometer formed directly on the carrier element, and connecting links associated with at least one channel.

7 Claims, 2 Drawing Sheets

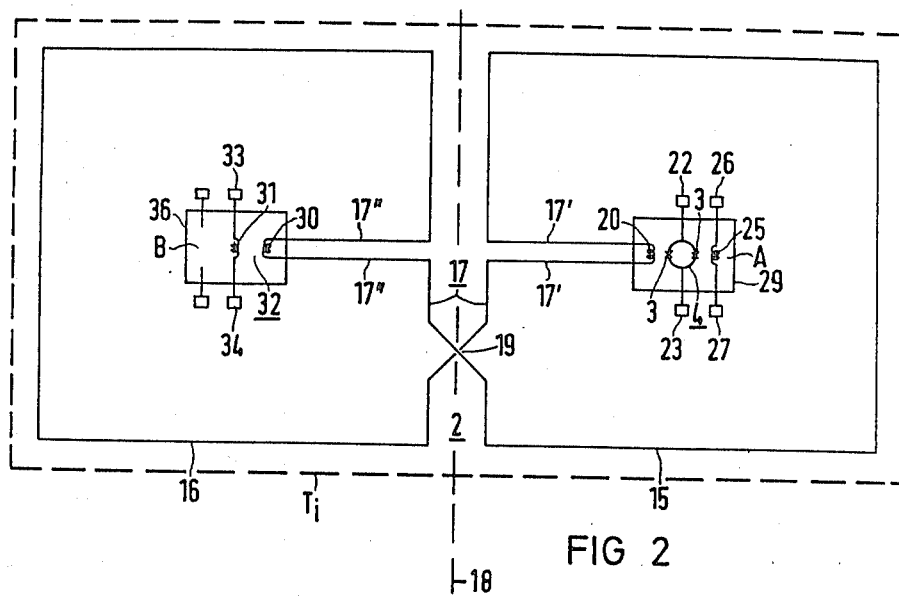
FIG 2
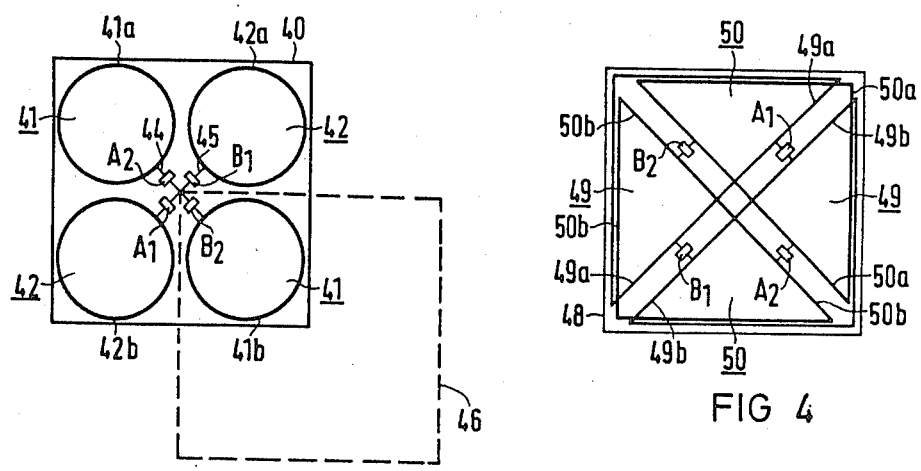
FIG 3
FIG 4

MULTICHANNEL DEVICE WITH SUPERCONDUCTOR GRADIOMETERS FOR MEASURING WEAK MAGNETIC FIELDS

BACKGROUND OF THE INVENTION

The present invention relates to a multichannel device for measuring weak, varying magnetic fields of field strengths down to less than $10^{-10}$T, in particular down to less than $10^{-12}$T, the device containing in each channel a gradiometer of the first or higher order, formed by superconducting loops on a flat carrier element; a superconducting direct current quantum interferometer (DC-SQUID), rigidly joined to the carrier element mechanically; and superconducting connecting links between the gradiometer and the interferometer, including a coupling-in coil to couple the gradiometer signals inductively into the interferometer; as well as electronics for processing and displaying the signals generated at the interferometers of the channels. Such a measuring device is known from DE-OS 32 47 543.

The use of superconducting quantum interferometers, also called "SQUIDS" (abbreviation of "Superconducting QUantum Interference Devices") to measure very weak magnetic fields is generally known (See "J. Phys. E: Sci. Instrum.", vol. 13, 1980, pages 801/13 or "IEEE Trans. Electr. Dev.", vol. ED-27, No. 10, Oct. 1980, pages 1896/1908). Therefore, considered a preferred field of application for these interferometers is also medical technology, in particular magnetocardiography and magnetoencephalography because the magnetic fields generated by magnetic heart or brain waves have field strengths in the order of magnitude of about 50 pT and 0.1 pT, respectively ("Biomagnetism - Proceedings Third International Workshop on Biomagnetism, Berlin 1980", Berlin/New York 1981, pages 3 to 31).

The device for measuring such magnetic fields as described in the above mentioned DE-OS is of multichannel design in order to be able to determine a three-dimensional field distribution in short measuring times and, hence, sufficient coherence of the field data. Towards this end, each channel contains a gradiometer of the first or higher order, formed by superconducting windings of a sensor or detector loop and a corresponding compensating loop. The detector loops and compensating loops of the channels are combined into units each which are separated from each other in space. Consequently, the detector loop of a gradiometer is relatively far removed from the compensating loop associated with it. The still non-uniform, biomagnetic near field to be picked up selectively with these loops in the gradiometer area ("Rev. Sci. Instrum.", vol. 53, No. 12, Dec. 1982, pages 1815/45) is then coupled into an associated direct current quantum interferometer (DC-SQUID) via superconducting connecting links. Such SQUIDS, containing two Josephson contacts, are more sensitive than so-called radio frequency (RF) SQUIDS and have less of a characteristic noise signal. Since the gradiometers may be designed as coupling transformers, it is also possible by means of appropriate coupling-in coils to couple the magnetic flux inductively into the respective interferometer (see also "IEEE Trans. Magn.", Vol. MAG-17, No. 1, Jan. 1981, pages 400/3).

In the known device, the superconducting loops of the gradiometers of all channels are formed on a flat carrier element common to all. Also to be fastened to this carrier element is a carrier plate on which the interferometers of all channels and the associated coupling-in coils are formed. These coupling-in coils are connected to the respective gradiometer loops by superconducting connecting lines essentially running across the carrier element. This requires a costly contacting technique between the coupling-in coils and the connecting lines to be connected to them.

In addition, the known multichannel measuring device also contains electronics to process and display the signals generated at the interferometers of the channels, for which purpose normally conducting leads are connected to the plate supporting the interferometers at appropriate connecting points.

It is true that with such a construction the balancing problems generally inherent in a multichannel design can be controlled and extensive coherence of the field data can be assured. However, the active area of the system of gradiometer loops is relatively expansive and, because of the planar structure of the carrier element, generally not adapted to the surface contour of a patient to be examined. The cryostat required for the device to maintain the superconducting operating state of the superconducting components, therefore, must be accordingly large.

SUMMARY OF THE INVENTION

It is therefore an object of the present invention to design the above-mentioned device for measuring biomagnetic fields with a system of gradiometers so that the active area of the system can be kept as small as possible and is at the same time adaptable to the contour of a patient to be examined.

The above and other objects are achieved according to the invention by the provision that several planar carrier elements are provided which are fastened to one common carrier structure, there being disposed on each carrier element the superconducting components associated with at least one channel, such as a gradiometer, interferometer formed directly on the carrier element, and connecting links.

In particular, the above and other objects of the present invention are achieved by a multichannel device for measuring weak, varying magnetic fields of field strengths down to less than $10^{-10}$T, in particular down to less than $10^{-12}$T, said device having in each channel a gradiometer of the first or higher order, formed by superconducting loops on a planar carrier element, a superconducting direct current quantum interferometer (DC-SQUID) rigidly joined to the carrier element mechanically, and superconducting connecting links between the gradiometer and the interferometer, including a coupling-in coil to couple the gradiometer signals inductively into the interferometer, and electronic means to process and display the signals generated at the interferometers of the channels, several planar carrier elements being provided which are fastened to one common carrier structure, these being disposed on each carrier element, the superconducting components comprising said gradiometer, said interferometer formed directly on the carrier element and said connecting links associated with at least one channel.

Thus, the measuring device according to the invention can be of modular construction; i.e., each channel represents a module rigidly attached to one common carrier structure conforming to the surface contours of the patient to be examined. The gradiometer loops of each module, designed as thin film structures, need be adjusted only once. Since the interferometer together with the associated gradiometer loops and the corresponding connecting links are located directly on a carrier element of their own on each module, the connecting technique between these superconducting components is simplified correspondingly and very good alignment is made possible. In addition, no vibration problems observed in known multichannel measuring devices occur. Furthermore, relatively small inductances of the interferometers are associated with the inductive coupling provided so that their sensitivity is improved accordingly.

With this measuring device so designed there is then advantageously made possible a parallel, i.e. simultaneous registration especially of so-called isogradient contours and, resulting therefrom, localization of the corresponding field sources, the measuring time being reduced in accordance with the number of channels. Since no errors, but only differences are measured with the system according to the invention, a substantial compensation of interference fields is achieved.

BRIEF DESCRIPTION OF THE DRAWINGS

For a more detailed explanation of the invention, the drawings are hereinafter referred to, in which:

FIG. 2 shows schematically the configuration of the superconducting components of a module of this measuring device; and FIGS. 3 and 4 indicate other embodiments of modules for the measuring device.

DETAILED DESCRIPTION

Figure 1:
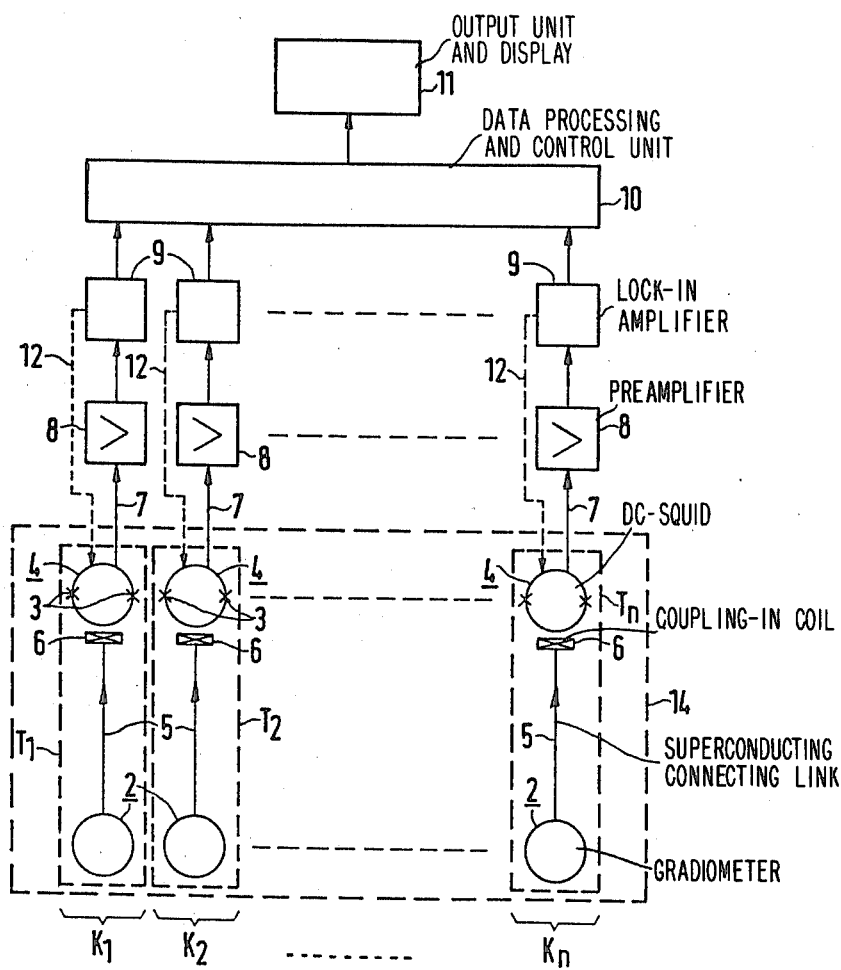
FIG. 1 is a block diagram of a measuring device according to the invention.

According to the block diagram of a measuring device according to the invention as indicated in FIG. 1 a predetermined number n of parallel measuring channels $K_l$ to $K_n$ is provided. In contrast to known multichannel devices for the determination of isofield contours, this device serves advantageously for the determination of isogradient contours. Each one of the, e.g., 30 channels contains a superconducting gradiometer of the first order, generally designated 2, each with two loops serving for detection and compensation, and one superconducting direct current quantum interferometer (DC-SQUID) 4 equipped with two Josephson contacts 3. In addition, there are provided in each channel superconducting connecting links 5 to connect the gradiometer to the interferometer, including a coupling-in coil 6, via which the signals received by the gradiometer 2 are coupled inductively into the respective interferometer 4. The signals, to be taken from the interferometers 4 via normally conducting leads 7, are then fed, e.g., via preamplifiers 8 and "lock-in" amplifiers 9 to a common electronic data processing and control unit 10 for further processing and to an output unit 11 for display. A feedback in the channels to the respective interferometers with the signals taken from the lock-in amplifiers 9 is indicated by a dotted line 12. The signal transmission directions are indicated in FIG. 1 by arrows at the respective lines.

As further illustrated in FIG. 1 by dashed lines, the gradiometers 2, the interferometers 4 and the associated connecting links 5 and 6 in each channel are to be located on respective flat carrier elements $T_l$ to $T_n$. These carrier elements, furthermore, are rigidly applied mechanically and jointly to a carrier structure indicated by a dashed line 14, and the shape of this carrier structure advantageously conforms to the surface shape of a patient to be examined and thus may also be arched in particular.

Details of the gradiometer and interferometer arrangement of a channel on a carrier element are evident from FIG. 2. It is based on a gradiometer of the first order whose shielding requirements are less severe than those of a gradiometer of zero order, as is known.

According to FIG. 2, a planar gradiometer 2 of the first order is applied to a planar carrier element $T_i$ ($1 \leq i \leq n$) not detailed, such as a thin quartz or silicon wafer. This gradiometer is formed by a first loop 15 and a second loop 16 as well as associated connecting links 17. Since the two loops 15 and 16 are directly adjacent, they are in effect compensatory; i.e. a sensing or detecting function as well as a compensating function is performed with the two loops. The loops 15 and 16, each enclosing an approximately square area, for example, are arranged symmetrical to a line 18. The areas may also be of a shape deviating therefrom, such as assuming the shape of another polygon or of a circle. The windings of the loops are connected in series so that the winding sense in the one loop is opposite to the winding sense of the other loop and that an intersection 19 of two connecting lines between them is formed in the area of the line of symmetry 18. Formed approximately in the center of the area enclosed by the first loop 15 is a direct current quantum interferometer 4 which has two Josephson contacts 3. Since, according to the invention, the magnetic flux of the gradiometer 2 is to be coupled into the interferometer 4 inductively, the leads of the loop 15 from the line of symmetry 18 are designed as parallel pieces of conductor 17' which go perpendicularly towards the interferometer, their ends facing the interferometer being connected to each other via a coupling-in coil 20. Appropriate coupling transformers formed of coupling-in coil and gradiometer loop are generally known (see, e.g., "IEEE Trans. Magn.", vol. MAG-17, No. 1, January 1981, pages 400/3). The inductance of the coupling-in coil 20 is adjusted to the inductance of the gradiometer loops. The signal thus generated in the interferometer 4 is then fed via electrical leads of normally conducting material, to be connected to interferometer terminals 22 and 23 and not detailed, to electronic circuitry for further processing. As is further indicated in FIG. 2, there may further be associated with the interferometer 4 a modulating coil 25 with terminals 26 and 27, also for normally conducting leads not shown. In addition, an annular shield 29 is formed around the interferometer and the coupling-in and modulating coils 20 and 25, respectively associated with it. The components of the measuring device according to the invention which are enclosed by this shield are generally designated A in the Figure, including the shield.

Beyond this, it may be seen from FIG. 2 that a substantial mirror-image symmetry regarding the line 18 should be provided for all superconducting components located outside of the shield 29. Accordingly, there are also provided two parallel conductor pieces 17" which go to the center of the other loop 16 and at whose central ends a primary inverse feedback winding 30 of as small an inductance as possible is formed. Together with an inverse feedback winding 31, this winding 30 forms an inverse feedback transformer 32, by means of which any variation of the gradiometer current can advantageously be compensated, thus linearizing the SQUID signal. The terminals of the secondary inverse feedback winding 31 required for such a "zeroing" of the gradiometer current and to be connected to leads not shown in FIG. 2 are designated 33 and 34, respectively. Beyond this, if applicable, there may yet be formed in the center of the other loop 16, likewise enclosed by a shielding ring 36, an unconnected interferometer and another modulating coil corresponding to the parts 4 or 25 in the center of the first loop 15. Such a mirror-image symmetrical design of an interferometer with integrated gradiometer of the first order brings with it production engineering advantages. The shield 36 and the components of the measuring device according to the invention enclosed by it are generally designated B in FIG. 2.

The normally conducting leads generally designated 7 in FIG. 1 and not shown in FIG. 2 may involve, in particular, unilateral or bilateral foil conductors such as copper strip conductors on a plastic foil. These foil conductors can then be glued to the respective carrier elements, the individual leads having to be connected to the superconducting components by means of a so-called bonding technique know per se.

According to FIGS. 1 and 2 it was assumed that there are to be disposed on a carrier element only the gradiometer respectively associated with a channel with the associated interferometer, and the corresponding connecting links between these components. Under circumstances, however, one can also provide, especially in order to assure optimum utilization of the carrier element surface, two orthogonally acting gradiometers, to be coordinated with two channels, on one carrier element. Corresponding embodiments with two gradiometers per carrier element are shown schematically in FIGS. 3 and 4 in top view.

According to FIG. 3 there are disposed on an approximately square carrier element 40 two gradiometers 41 and 42, each with two approximately circular loops 41a and b or 42a and b, respectively, in diagonally opposite corner areas. The two gradiometers may be of a design, e.g., substantially according to the gradiometer shown in FIG. 2. However, it is also possible, as FIG. 3 indicates, to move the associated direct current quantum interferometers and inverse feedback transformers with the appropriate shields into the area of the connecting lines between the respective gradiometer loops. These components, to be arranged there and not detailed in the Figure, thus correspond, at least largely, to the units designated A and B in FIG. 2, so that these components are marked accordingly $A_1$ and $B_1$ or $A_2$ and $B_2$, respectively, in FIG. 3. The connecting conductors 44 and 45 belonging to the respective gradiometers then overlap in the center area. As a dashed line is to indicate further in the Figure, adjacent carrier elements 40 and 46 may, if necessary, overlap with their gradiometer loops disposed in corner areas. This is possible because of the zeroing of the gradiometer current. An even better surface utilization is achieved in this manner.

Deviating from the embodiment according to FIG. 3, four loops 49a, b and 50a, b in the form of right triangles and associated with two gradiometers 49 and 50 overlap partly. This is again possible because of the mentioned zerioing of the gradiometer currents. In the relatively narrow diagonal zones in between the gradiometer loops 49a, b and 50a, b the two associated interferometers with inverse feedback transformers are then located. The units $A_1$, $B_1$ and $A_2$, $B_2$ thus formed there correspond to the units indicated in FIG. 3.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly to be regarded in an illustrative rather than a restrictive sense.

What is claimed is:

1. A multichannel device for measuring weak, varying magnetic fields of field strengths down to less than $10^{-10}T$, in particular down to less than $10^{-12}T$, said device comprising in each channel a gradiometer of the first or higher order formed by superconducting loops on a planar carrier element, a superconducting direct current quantum interferometer (DC-SQUID) rigidly joined to the carrier element mechanically, and superconducting connecting links between the gradiometer and the interferometer, including a coupling-in coil to couple the gradiometer signals inductively into the interferometer, and electronic means coupled to the interferometers to process and display the signals generated at the inteferometers of the channels, several planar carrier elements being provided which are fastened to one common carrier structure, there being disposed on each carrier element the superconducting components comprising at least one of said gradiometers, at least one of said interferometers formed directly on the carrier element, and at least one of said connecting links associated with respective ones of said channels.

2. The measuring device related in claim 1, wherein the interferometers are formed within the area enclosed by a gradiometer loop of a gradiometer associated with the interferometer.

3. The measuring device recited in claim 1 having gradiometers of the first order, each containing a first and another gradiometer loop, further comprising means for the suppression of gradiometer current comprising an inverse feedback transformer whose primary winding is connected to the second gradiometer loop while the coupling-in coil is connected to the first gradiometer loop.

4. The measuring device recited in claim 3, wherein the first gradiometer loop with the coupling-in coil and the second gradiometer loop with the primary winding of the inverse feedback transformer are arranged so as to be, at least substantially, symmetrical to a centerline.

5. The measuring device recited in claim 1, wherein there are disposed on the carrier elements two gradiometers each with gradiometer loops evenly distributed over the respective carrier element.

6. The measuring device recited in claim 5, wherein the coils of the gradiometers are of circular or triangular shape and disposed in the corner areas of the approximately square carrier elements.

7. The measuring device recited in claim 1 wherein the shape of the carrier structure is adapted to that of a patient to be examined.

* * * * *